(12) United States Patent
Oh et al.

(10) Patent No.: US 8,853,345 B2
(45) Date of Patent: Oct. 7, 2014

(54) POLYMER, METHOD FOR PRODUCING THE SAME, AND RESIST COMPOSITION CONTAINING THE SAME

(75) Inventors: Jung-Hoon Oh, Chungcheongnam-do (KR); Joon Hee Han, Chungcheongnam-do (KR); Tae Gon Kim, Chungcheongnam-do (KR); Hyun Sang Joo, Daejeon (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 224 days.

(21) Appl. No.: 13/330,971

(22) Filed: Dec. 20, 2011

(65) Prior Publication Data

US 2012/0165499 A1   Jun. 28, 2012

(30) Foreign Application Priority Data

Dec. 24, 2010  (KR) .................. 10-2010-0134284

(51) Int. Cl.
  *C08G 63/668*  (2006.01)
  *G03F 7/20*  (2006.01)
  *G03F 7/039*  (2006.01)

(52) U.S. Cl.
  CPC ............ *C08G 63/668* (2013.01); *G03F 7/2039* (2013.01); *G03F 7/0392* (2013.01); *G03F 7/0395* (2013.01)
  USPC .......... 528/361; 528/272; 526/280; 526/332; 526/346; 216/41; 430/270.1; 430/280.1; 430/285.1; 430/324

(58) Field of Classification Search
  CPC ... C08G 63/668; G03F 7/0392; G03F 7/0395; C07C 2103/74
  USPC .......... 528/271, 272, 261, 361; 526/280, 332, 526/346; 216/41; 430/270.1, 280.1, 285.1, 430/324
  See application file for complete search history.

(56) References Cited

U.S. PATENT DOCUMENTS

| | | | |
|---|---|---|---|
| 4,343,888 A | 8/1982 | Burg | |
| 6,042,990 A | 3/2000 | Shao et al. | |
| 6,313,327 B1 * | 11/2001 | Seo et al. | 552/553 |
| 6,803,170 B2 * | 10/2004 | Toriumi et al. | 430/270.1 |
| 2010/0081079 A1 | 4/2010 | Joo et al. | |

FOREIGN PATENT DOCUMENTS

EP  1067112 A2  1/2001

OTHER PUBLICATIONS

Office Action dated Dec. 20, 2013 in connection with corresponding Chinese Application No. 201110447867.

* cited by examiner

*Primary Examiner* — Frances Tischler
(74) *Attorney, Agent, or Firm* — Davidson, Davidson & Kappel, LLC

(57) ABSTRACT

Provided is a copolymer. The copolymer, when incorporated into a resist composition, can provide a satisfactory resist pattern with high sensitivity, high resolution, high etching resistance and a reduced amount of outgas.

6 Claims, 4 Drawing Sheets

POLYMER, METHOD FOR PRODUCING THE SAME, AND RESIST COMPOSITION CONTAINING THE SAME

TECHNICAL FIELD

The present invention relates to a novel copolymer, a method for producing the polymer, and a resist composition containing the copolymer, and more particularly, to a copolymer which, when applied to lithography including extreme ultraviolet (EUV) lithography, can give a satisfactory resist pattern with high sensitivity, high resolution, high etching resistance, and a reduced amount of outgas, as well as a method for producing the copolymer, and a resist composition containing the copolymer.

BACKGROUND ART

Along with the recent high integration of semiconductor elements, there is a growing tendency to produce ultra-large scale integrations, and there is a demand for the development of a technology for forming ultrafine patterns having a line width of 0.10 micrometers or less in lithographic processes.

Accordingly, the wavelength of the light used in exposure processes is even shortened from the region of conventionally used g-line and i-line, and therefore, attention is being paid to studies on lithography using far-ultraviolet radiation, KrF excimer laser light, ArF excimer laser light, EUV, X-radiation, electron beam and the like.

Particularly, in connection with the light source, electron beam lithography has been valued as a next-generation or next next-generation pattern formation technology, and in this regard, development of a high sensitivity and high resolution positive type resist is desired.

On the other hand, high sensitivity is in direction relationship with the processing speed of the lithographic process. This is because high sensitivity is related to the power source of an electron beam, and as the sensitivity of a resist is higher, pattern formation is enabled even by a power source with a smaller amount of energy; however, sensitivity is poor, and a power source with a higher amount of energy is required.

However, in the case of an electron beam, the light of the electron beam tends to be absorbed by matter, and therefore, with regard to EUV lithography, there has been an attempt to supplement such a characteristic by using a reflector. However, the reflectors used for EUV lithography do not have a reflection efficiency of 100% so that there are difficulties in enhancing the performance of power sources.

In regard to positive resists for electron beam, since sensitivity, resolution and line edge roughness are in a complementary relationship of trading off each other, when an increase in the sensitivity is promoted, the resolution is decreased, and line edge roughness is deteriorated. Therefore, there is a strong demand for the development of a resist which can satisfy the characteristics of sensitivity, resolution and line edge roughness all at the same time.

Conventional resist materials that have been generally used for g-line, i-line, KrF and ArF are chemically amplified resists (CAR), and copolymers produced by radical polymerization have been mainly used.

Specifically, when a solution of a polymer resist material such as polymethyl methacrylate, polyhydroxystyrene having an acid-dissociating reactive group, or polyalkyl methacrylate is applied on a substrate to produce a resist thin film, and the resist thin film is irradiated with ultraviolet radiation, far-ultraviolet radiation, electron beam, extreme ultraviolet radiation, or X-radiation, a line pattern having a line width of about 45 to 100 nm can be formed.

However, such a polymeric resist based on a copolymer generally has a molecular weight as large as about 20,000 to 100,000, and the molecular weight distribution is also relatively broad. Therefore, during the process of forming a fine pattern, roughness is likely to occur, and it is difficult to control the dimension of the pattern, so that the product yield may be lowered. Therefore, there are limitations in pattern miniaturization in the conventional lithographic technology of using polymeric resist materials.

In order to produce finer lithographic patterns, studies have been conducted on various resist materials. But, those single molecule type resist compounds that are currently known have problems such as low etching resistance, a large amount of outgas, low solubility in the safety solvents used in semiconductor production processes, and poor resist pattern shapes. Thus, there is a demand for a novel resist material which can simultaneously satisfy complementary characteristics such as a satisfactory pattern shape with high sensitivity and high resolution, and satisfactory line edge roughness.

DISCLOSURE OF THE INVENTION

Problems to be Solved by the Invention

An object of the present invention is to provide a novel copolymer which exhibits high heat resistance at the time of application to resists, has excellent film forming properties, is hardly sublimable, and is capable of enhancing alkali developability and etching resistance. Another object of the present invention is to provide a method for producing the above-described copolymer, and a resist composition containing the above-described copolymer.

Means for Solving the Problem

According to an aspect of the present invention, there is provided a copolymer containing a repeating unit represented by the following formula (1):

[Chemical Formula 1]

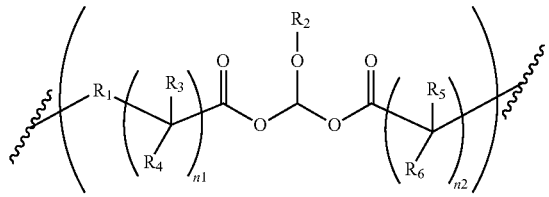

wherein $R_1$ represents any one selected from the group consisting of an alkanediyl group, a heteroalkanediyl group, a cycloalkanediyl group, a heterocycloalkanediyl group, an arylene group, a heteroarylene group, and an alkylarylene group; $R_2$ represents any one selected from the group consisting of a hydrogen atom, an alkyl group, a heteroalkyl group, a cycloalkyl group, a heterocycloalkyl group, an aryl group, a heteroaryl group, an alkoxy group and an alkylalkoxy group; $R_3$, $R_4$, $R_5$ and $R_6$ each independently represent any one selected from a hydrogen atom and an alkyl group having 1 to 5 carbon atoms; n1 represents an integer from 0 to 10; and n2 represents an integer from 0 to 10.

$R_1$ may be any one selected from the group consisting of moieties represented by the following formulas (1-1) to (1-4).

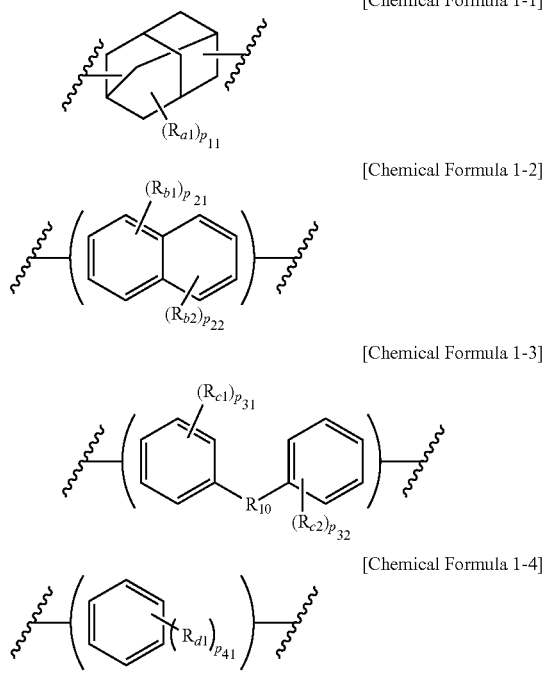

[Chemical Formula 1-1]
[Chemical Formula 1-2]
[Chemical Formula 1-3]
[Chemical Formula 1-4]

In the formulas (1-1) to (1-4), $R_{a1}$, $R_{b1}$, $R_{b2}$, $R_{c1}$, $R_{c2}$ and $R_{d1}$ each independently represent any one selected from the group consisting of an alkyl group having 1 to 10 carbon atoms and an alkoxy group having 1 to 10 carbon atoms; $R_{10}$ represents any one selected from the group consisting of O, NR', S and CO; R' represents any one selected from a hydrogen atom and an alkyl group having 1 to 5 carbon atoms; $p_{11}$ represents an integer from 1 to 14; $p_{21}$ and $p_{22}$ each independently represent an integer from 1 to 4, while the sum of $p_{21}$ and $p_{22}$ is not greater than 6; $p_{31}$ and $p_{32}$ each independently represent an integer from 1 to 5, while the sum of $p_{31}$ and $p_{32}$ is not greater than 8; and $p_{41}$ represents an integer from 1 to 4.

The copolymer may have a weight average molecular weight as measured by gel permeation chromatography of 500 to 100,000 g/mol.

According to another aspect of the present invention, there is provided a method for producing a copolymer containing a repeating unit represented by the above formula (1), the method including a step of allowing a compound represented by the following formula (2) and a compound represented by the following formula (3) to react in the presence of a basic catalyst.

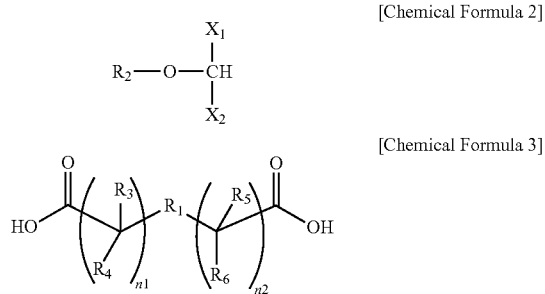

[Chemical Formula 2]
[Chemical Formula 3]

wherein in the formulas (2) and (3), $R_1$ represents any one selected from the group consisting of an alkanediyl group, a heteroalkanediyl group, a cycloalkanediyl group, a heterocycloalkanediyl group, an arylene group, a heteroarylene group and an alkylarylene group; $R_2$ represents any one selected from the group consisting of a hydrogen atom, an alkyl group, a hetoroalkyl group, a cycloalkyl group, a heterocycloalkyl group, an aryl group, a heteroaryl group, an alkoxy group and an alkylalkoxy group; $R_3$, $R_4$, $R_5$ and $R_6$ each independently represent any one selected from a hydrogen atom and an alkyl group having 1 to 5 carbon atoms; $X_1$ and $X_2$ each independently represent any one selected from the group consisting of a halogen atom and an alkoxy group having 1 to 10 carbon atoms; n1 represents an integer from 0 to 10; and n2 represents an integer from 0 to 10.

The basic catalyst may be any one selected from the group consisting of an amine, a pyridine and a combination thereof.

The compound of formula (2) and the compound of formula (3) may be used at a molar ratio of 1:0.5 to 1:3.0.

According to another aspect of the present invention, there is provided a resist composition which contains the above-described copolymer.

Effects Of The Invention

When the copolymer of the present invention is applied to a resist composition, a satisfactory resist pattern with high sensitivity, high resolution, high etching resistance, and a reduced amount of outgas can be obtained upon the application to lithography such as EUV lithography.

BEST MODE FOR CARRYING OUT THE INVENTION

Figure 1:
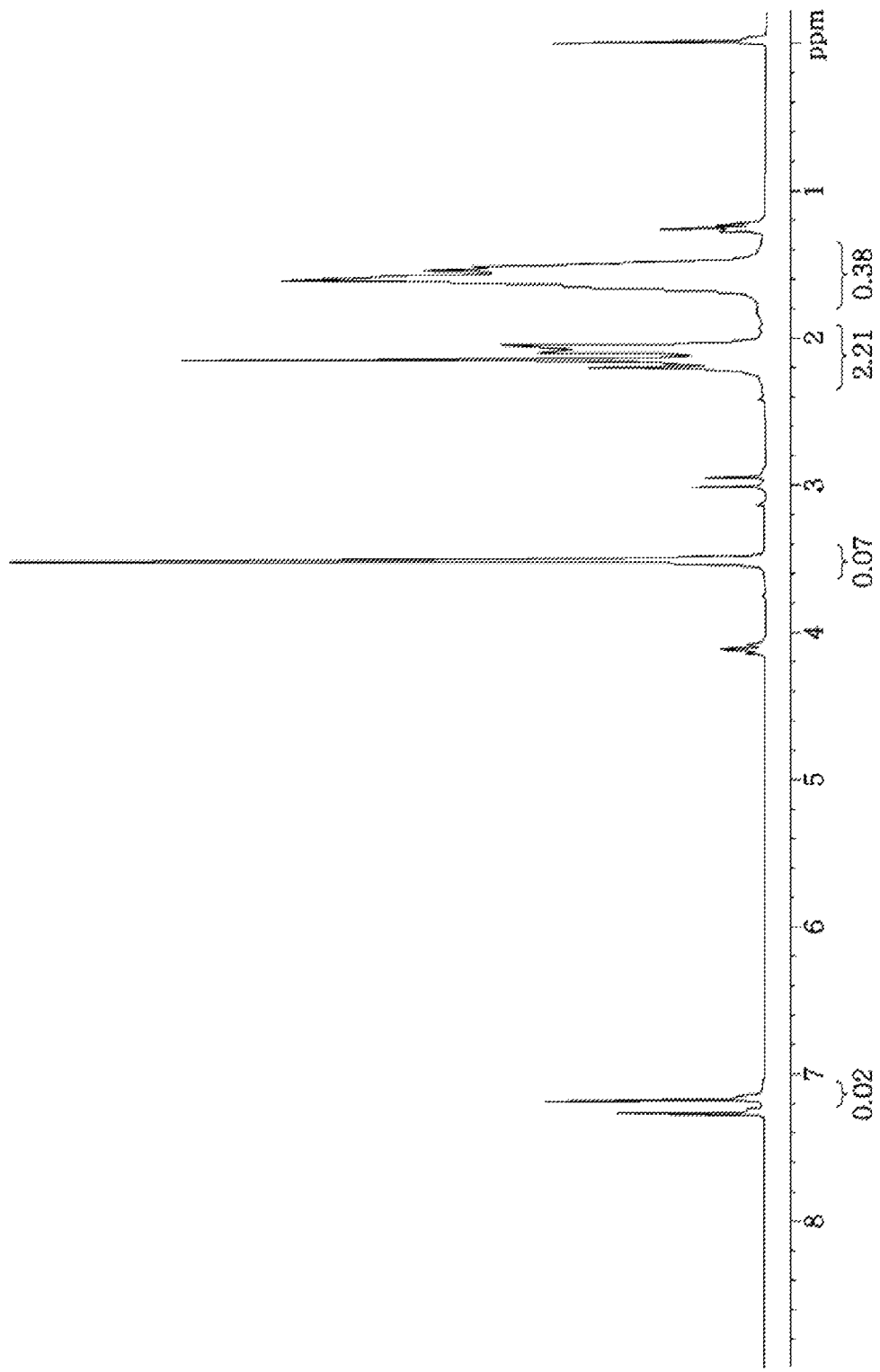
FIG. 1 shows the NMR data of the copolymer represented by the formula (1-11) produced in Synthesis Example 1 according to an embodiment of the present invention.

Hereinafter, the present invention will be described in more detail.

The terms used in this specification have definitions as will be described below.

Unless particularly stated otherwise, the prefix "hetero-" as used herein means that one to three carbon atoms are substituted by heteroatoms selected from the group consisting of —N—, —O—, —S— and —P—. For example, a heteroalkyl group means that one to three carbon atoms among the carbon atoms of an alkyl group have been substituted by those heteroatoms.

Unless particularly stated otherwise, the term alkanediyl as used herein means a divalent atomic group obtained by extracting two hydrogen atoms from an alkane, and may be represented by the formula: $-C_nH_{2n}-$.

Unless particularly stated otherwise, the term cycloalkanediyl as used herein means a divalent atomic group obtained by extracting two hydrogen atoms from a cycloalkane.

Unless particularly stated otherwise, the term arylene as used herein means a divalent atomic group obtained by extracting two hydrogen atoms from an aryl, and the arylene may include a moiety containing one benzene ring, as well as a moiety containing 2 to 7 benzene rings.

Unless particularly stated otherwise, the term alkylarylene as used herein means a compound containing an alkanediyl and an arylene, or a derivative thereof.

Unless particularly stated otherwise, the term halogen atom as used herein means any one selected from the group consisting of fluorine, chloride, bromine and iodine.

Unless particularly stated otherwise, the term alkyl group as used herein includes a linear alkyl group and a branched alkyl group, and also includes a primary alkyl group, a secondary alkyl group, and a tertiary alkyl group.

Unless particularly stated otherwise, the term cycloalkyl group includes monocyclic, bicyclic, tricyclic and tetracyclic alkyl groups. The term cycloalkyl group also includes a polycyclic cycloalkyl group such as an adamantyl group or a norbornyl group.

Unless particularly stated otherwise, the term aryl group as used herein means a hydrocarbon containing one or two or more aromatic rings. Examples include a benzyl group and a naphthyl group.

Unless particularly stated otherwise, the term alkylalkoxy group means a compound containing an alkoxy group and an alkanediyl moiety, or a derivative thereof.

Unless particularly stated otherwise, the term perfluoroalkyl group means an alkyl group in which a part or all of hydrogen atoms have been substituted by fluorine atoms.

Unless particularly stated otherwise, the alkanediyl group means an alkanediyl group having 1 to 40 carbon atoms; the heteroalkanediyl group means a heteroalkanediyl group having 1 to 40 carbon atoms; the cycloalkanediyl group means a cycloalkanediyl group having 3 to 40 carbon atoms; the heterocycloalkanediyl group means a heterocycloalkanediyl group having 1 to 40 carbon atoms; the arylene group means an arylene group having 6 to 40 carbon atoms; the heteroarylene group means a heteroarylene group having 3 to 40 carbon atoms; the alkylarylene group means an alkylarylene group having 7 to 40 carbon atoms; the alkyl group means an alkyl group having 1 to 40 carbon atoms; the heteroalkyl group means a heteroalkyl group having 1 to 40 carbon atoms; the cycloalkyl group means a cycloalkyl group having 3 to 40 carbon atoms; the heterocycloalkyl group means a heterocycloalkyl group having 1 to 40 carbon atoms; the aryl group means an aryl group having 6 to 40 carbon atoms; the heteroaryl group means a heteroaryl group having 2 to 40 carbon atoms; the alkoxy group means an alkoxy group having 1 to 10 carbon atoms; and the alkylalkoxy group means an alkylalkoxy group having 2 to 20 carbon atoms.

According to the present invention, the compounds and substituents may all be substituted or unsubstituted, unless particularly stated otherwise. Here, the term "substituted" means that a hydrogen atom has been replaced by any one selected from the group consisting of a halogen atom, a hydroxyl group, a carboxyl group, a cyano group, a nitro group, an amino group, a thio group, a methylthio group, an alkoxy group, a nitrile group, an aldehyde group, an epoxy group, an ether group, an ester group, a carbonyl group, an acetal group, a ketone group, an alkyl group, a cycloalkyl group, a heterocycloalkyl group, an allyl group, a benzyl group, an aryl group, a heteroaryl group, a perfluoroalkyl group, derivatives thereof, and combinations thereof.

The copolymer according to an embodiment of the present invention contains a repeating unit represented by the following formula (1):

[Chemical Formula 1]

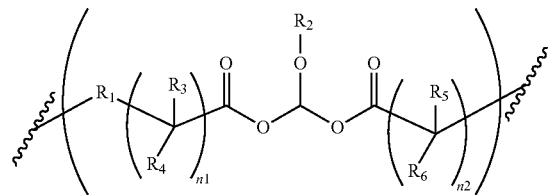

In the formula (1), $R_2$ represents any one selected from the group consisting of a hydrogen atom, an alkyl group, a heteroalkyl group, a cycloalkyl group, a heterocycloalkyl group, an aryl group, a heteroaryl group, an alkoxy group and an alkylalkoxy group, and may be any one selected from the group consisting of an alkyl group having 1 to 10 carbon atoms, a heteroalkyl group having 1 to 10 carbon atoms, a cycloalkyl group having 3 to 12 carbon atoms, a heterocycloalkyl group having 3 to 12 carbon atoms, an aryl group having 6 to 20 carbon atoms, a heteroaryl group having 3 to 20 carbon atoms, an alkoxy group having 1 to 10 carbon atoms, and an alkylalkoxy group having 2 to 10 carbon atoms.

In the formula (1), $R_3$, $R_4$, $R_5$ and $R_6$ each independently represent any one selected from the group consisting of a hydrogen atom and an alkyl group having 1 to 5 carbon atoms, and each may be any one selected from the group consisting of a hydrogen atom, a methyl group and an ethyl group.

In the formula (1), n1 represents an integer from 0 to 10, and may be an integer from 0 to 5.

In the formula (1), n2 represents an integer from 0 to 10, and may be an integer from 0 to 5.

In the formula (1), $R_1$ represents any one selected from an alkanediyl group, a heteroalkanediyl group, a cycloalkanediyl group, a heterocycloalkanediyl group, an arylene group, a heteroarylene group, and an alkylarylene group, and $R_1$ may be any one selected from the group consisting of an alkanediyl group having 1 to 20 carbon atoms, a heteroalkanediyl group having 1 to 20 carbon atoms, a cycloalkanediyl group having 3 to 20 carbon atoms, a heterocycloalkanediyl group having 1 to 20 carbon atoms, an arylene group having 6 to 30 carbon atoms, a heteroarylene group having 3 to 30 carbon atoms, and an alkylarylene group having 7 to 30 carbon atoms. Preferably, R1 may be any one selected from the group consisting of a cycloalkanediyl group having 5 to 15 carbon atoms, a heterocycloalkanediyl group having 2 to 15 carbon atoms, an arylene group having 6 to 18 carbon atoms, a heteroarylene group having 2 to 18 carbon atoms, and an alkylarylene group having 7 to 20 carbon atoms.

The copolymer containing a repeating unit represented by the formula (1) may include m pieces of the repeating units, while m may be 1 to 1000, preferably 1 to 400, and more preferably 1 to 100. When the copolymer represented by the formula (1) has repeating units in the range of m as described above, a resist composition having superior line edge roughness and excellent sensitivity and resolution can be obtained.

In the formula (1), R1 may be any one selected from the group consisting of moieties represented by the following formulas (1-1) to (1-20).

[Chemical Formula 1-1]
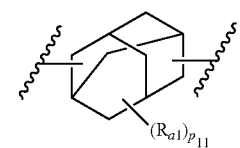
[Chemical Formula 1-2]
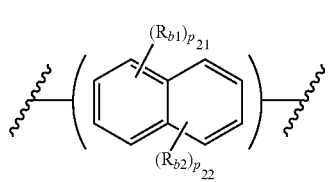
[Chemical Formula 1-3]
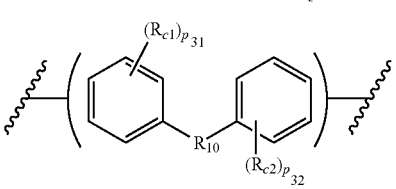
[Chemical Formula 1-4]
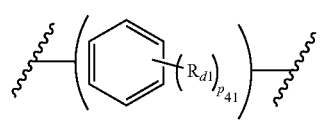
[Chemical Formula 1-5]
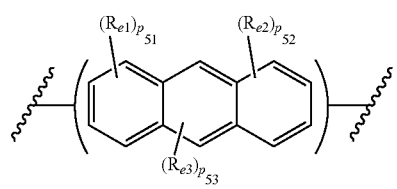
[Chemical Formula 1-6]
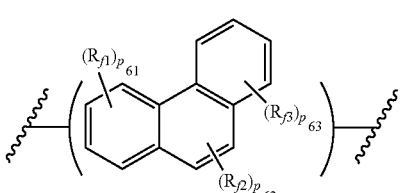
[Chemical Formula 1-7]
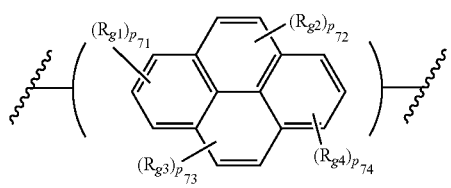
[Chemical Formula 1-8]
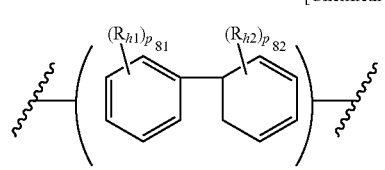
[Chemical Formula 1-9]
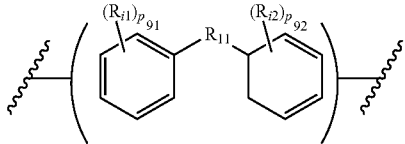
[Chemical Formula 1-10]
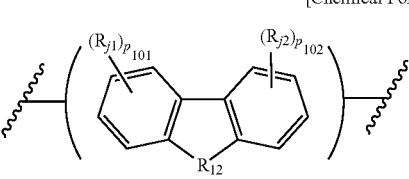
[Chemical Formula 1-11]
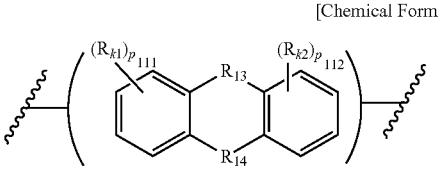
[Chemical Formula 1-12]
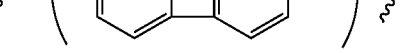
[Chemical Formula 1-13]
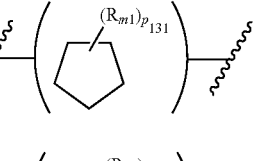
[Chemical Formula 1-14]
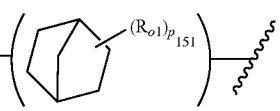
[Chemical Formula 1-15]
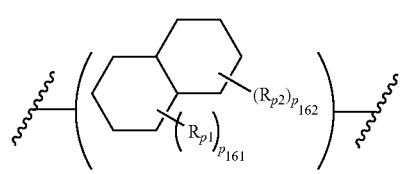
[Chemical Formula 1-16]
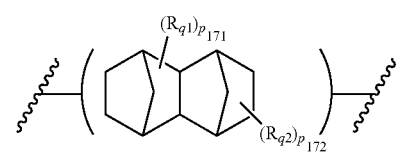
[Chemical Formula 1-17]

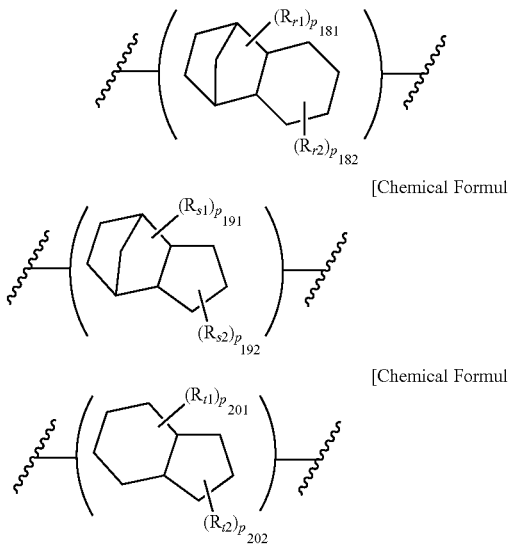

[Chemical Formula 1-18]

[Chemical Formula 1-19]

[Chemical Formula 1-20]

In the formulas (1-1) to (1-20), $R_{a1}$, $R_{b1}$, $R_{b2}$, $R_{c1}$, $R_{c2}$, $R_{d1}$, $R_{e1}$, $R_{e2}$, $R_{e3}$, $R_{f1}$, $R_{f2}$, $R_{f3}$, $R_{g1}$, $R_{g2}$, $R_{g3}$, $R_{g4}$, $R_{h1}$, $R_{h2}$, $R_{i1}$, $R_{i2}$, $R_{j1}$, $R_{j2}$, $R_{k1}$, $R_{k2}$, $R_{l1}$, $R_{l2}$, $R_{m1}$, $R_{n1}$, $R_{o1}$, $R_{p1}$, $R_{p2}$, $R_{q1}$, $R_{q2}$, $R_{r1}$, $R_{r2}$, $R_{s1}$, $R_{s2}$, $R_{t1}$ and $R_{t2}$ each independently represent any one selected from the group consisting of a hydrogen atom, an alkyl group having 1 to 10 carbon atoms and an alkoxy group having 1 to 10 carbon atoms, and may be each independently represent any one selected from the group consisting of a hydrogen atom and an alkyl group having 1 to 5 carbon atoms.

In the formulas (1-3), (1-9), (1-10) and (1-11), $R_{10}$ to $R_{14}$ each independently represent any one selected from the group consisting of O, NR', S and CO, and R' represents any one selected from the group consisting of a hydrogen atom and an alkyl group having 1 to 5 carbon atoms. $R_{10}$ to $R_{14}$ may be each independently represent any one selected from the group consisting of O and S.

In the formula (1-1), $p_{11}$ represents an integer from 1 to 14.

In the formula (1-2), $p_{21}$ and $p_{22}$ each independently represent an integer from 1 to 4, and the sum of $p_{21}$ and $p_{22}$ is not greater than 6.

In the formula (1-3), $p_{31}$ and $p_{32}$ each independently represent an integer from 1 to 5, and the sum of $p_{31}$ and $p_{32}$ is not greater than 8.

In the formula (1-4), $p_{41}$ represents an integer from 1 to 4.

In the formula (1-5), $p_{51}$ and $p_{53}$ each independently represent an integer from 1 to 4, and $p_{52}$ represents an integer of 1 to 2, while the sum of $p_{51}$ to $p_{53}$ is not greater than 8.

In the formula (1-6), $p_{61}$ and $p_{63}$ each independently represent an integer from 1 to 4, and $p_{62}$ represents an integer of 1 to 2, while the sum of $p_{61}$ to $p_{63}$ is not greater than 8.

In the formula (1-7), $p_{71}$ and $p_{74}$ each independently represent an integer from 1 to 3, $p_{72}$ and $p_{73}$ each independently represent an integer of 1 to 2, while the sum of $p_{71}$ to $p_{74}$ is not greater than 8.

In the formula (1-8) $p_{81}$ and $p_{82}$ each independently represent an integer from 1 to 5, and the sum of $p_{81}$ and $p_{82}$ is not greater than 8.

In the formula (1-9), $p_{91}$ and $p_{92}$ each independently represent an integer from 1 to 5, and the sum of $p_{91}$ and $p_{92}$ is not greater than 8.

In the formula (1-10), $p_{101}$ and $p_{102}$ each independently represent an integer from 1 to 3.

In the formula (1-11), $p_{111}$ and $p_{112}$ each independently represent an integer from 1 to 3.

In the formula (1-12), $p_{121}$ and $p_{122}$ each independently represent an integer from 1 to 3.

In the formula (1-13), $p_{131}$ represents an integer form 1 to 8.

In the formula (1-14), $p_{141}$ represents an integer from 1 to 10.

In the formula (1-15), $p_{151}$ represents an integer from 1 to 10.

In the formula (1-16), $p_{161}$ and $p_{162}$ each independently represent an integer from 1 to 8, and the sum of $p_{161}$ and $p_{162}$ is not greater than 14.

In the formula (1-17), $p_{171}$ and $p_{172}$ each independently represent an integer from 1 to 8, and the sum of $p_{171}$ and $p_{172}$ is not greater than 14.

In the formula (1-18), $p_{181}$ represents an integer from 1 to 8, and $p_{182}$ represents an integer from 1 to 8, while the sum of $p_{181}$ and $p_{182}$ is not greater than 14.

In the formula (1-19), $p_{191}$ represents an integer from 1 to 8, and $p_{192}$ represents an integer from 1 to 6, while the sum of $p_{191}$ and $p_{192}$ is not greater than 12.

In the formula (1-20), $p_{201}$ represents an integer from 1 to 8, and $p_{202}$ represents an integer from 1 to 6, while the sum of $p_{201}$ and $p_{202}$ is not greater than 12.

The copolymer containing the repeating unit represented by the formula (1) may have a weight average molecular weight as measured by gel permeation chromatography of 500 to 100,000 g/mol, preferably 500 to 70,000 g/mol, and more preferably 1,000 to 25,000 g/mol.

When the weight average molecular weight of the copolymer is in the range described above, the copolymer may have excellent line edge roughness and may provide excellent edge patterns. Furthermore, if the weight average molecular weight of the copolymer is less than 500 g/mol, etching resistance may be deteriorated, and if the weight average molecular weight is greater than 100,000 g/mol, line edge roughness, solubility and resolution may be lowered.

The copolymer containing the repeating unit represented by the formula (1) may have a molecular weight distribution of 1 to 5, preferably 1 to 4, and more preferably 2 to 3.5.

When the copolymer containing the repeating unit represented by the formula (1) has a molecular weight distribution in the range described above, the line edge roughness property may become excellent.

The copolymer containing the repeating unit represented by the formula (1) is a novel acetal-based copolymer, and when a resist composition containing the copolymer is used to form a resist thin film, the resist composition has excellent film-forming properties, has negligible sublimability, and has excellent alkali developability and etching resistance. Therefore, the resist composition can be usefully used as a main ingredient of a resist material.

According to another embodiment of the present invention, there is provided a method for producing a copolymer containing a repeating unit represented by the formula (1), which method includes a step of allowing a compound represented by the following formula (2) and a compound represented by the following formula (3) to react in the presence of a basic catalyst.

[Chemical Formula 1]

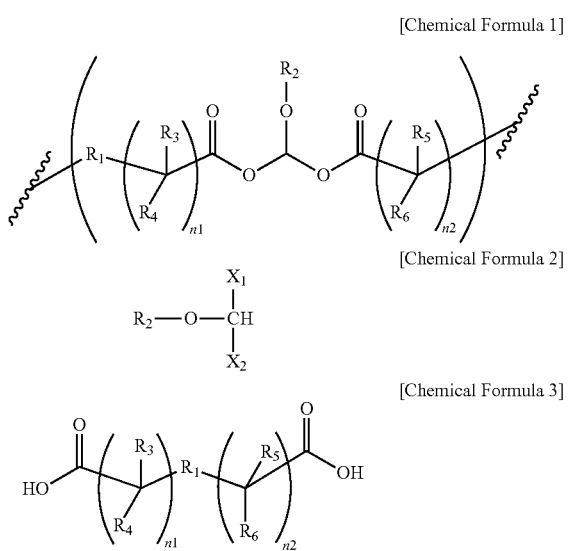

[Chemical Formula 2]

[Chemical Formula 3]

In the formula (2), $X_1$ and $X_2$ each independently represent any one selected from the group consisting of a halogen atom and an alkoxy group having 1 to 10 carbon atoms, and $X_1$ and $X_2$ may be each independently represent any one selected from the group consisting of a fluorine atom and a chlorine atom.

In the formulas (1) to (3), $R_1$, $R_2$, $R_3$, $R_4$, $R_5$, $R_6$, n1 and n2 respectively have the same meanings as defined for the formula (1).

The basic catalyst may be any one selected from the group consisting of amines, including primary amines, secondary amines and tertiary amines, pyridines, organometallic compounds and combinations thereof.

Specific examples of the basic catalyst that can be used for the present invention include methylamine, ethylamine, propylamine, butylamine, ethylenediamine, hexamethylenediamine, dimethylamine, diethylamine, diisopropylamine, cyclohexylamine, dicyclohexylamine, ethanolamine, diethanolamine, dimethylmonoethanolamine, monomethyldiethanolamine, triethanolamine, diazabicyclooctane, diazabicyclononene, diazabicycloundecene, hexamethylenetetraamine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, trimethylamine, triethylamine, tripropylamine, dimethylethylamine, dimethylisopropylamine, diethylmethylamine, dimethylbutylamine, dimethylhexylamine, diisopropylethylamine, dimethylcyclohexylamine, tetramethyldiaminomethane, dimethylbenzylamine, tetramethylethylenediamine, tetramethyl-1,4-aminobutane, tetramethyl-1,3-diaminobutane, tetramethyl-1,6-diaminohexane, pentamethyldiethylenetriamine, 1-methylpiperidine, 1-ethylpiperidine, N,N-methylpiperazine, N-methylmorpholine, 1,8-diazabicyclo[5.4.0]-7-undecene (DBU), 1,5-diazabicyclo[4.3.0]-5-nonene (DBN), 2,4-diazabicyclo[2.2.2]octane (DABCO), N,N-dimethylaniline, N,N-diethylaniline, lithium hydroxide, sodium hydroxide, potassium hydroxide, barium hydroxide, calcium hydroxide, potassium carbonate, and combinations thereof.

When any one selected from the group consisting of the above-described amines, pyridines and combinations thereof is used as the basic catalyst, it is advantageous in that when the copolymer is applied to an electronic material, the content of metal impurities can be minimized. Examples of the amines and pyridines that can be used for the present invention include methylamine, ethylamine, propylamine, butylamine, ethylenediamine, hexamethylenediamine, dimethylamine, diethylamine, diisopropylamine, cyclohexylamine, dicyclohexylamine, ethanolamine, diethanolamine, dimethylmonoethanolamine, monomethyldiethanolamine, triethanolamine, diazabicyclooctane, diazabicyclononene, diazabicycloundecene, hexamethylenetetraamine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, trimethylamine, triethylamine, tripropylamine, dimethylethylamine, dimethylisopropylamine, diethylmethylamine, dimethylbutylamine, dimethylhexylamine, diisopropylethylamine, dimethylcyclohexylamine, tetramethyldiaminomethane, dimethylbenzylamine, tetramethylethylenediamine, tetramethyl-1,4-aminobutane, tetramethyl-1,3-diaminobutane, tetramethyl-1,6-diaminohexane, pentamethyldiethylenetriamine, 1-methylpiperidine, 1-ethylpiperidine, N,N-methylpiperazine, N-methylmorpholine, 1,8-diazabicyclo[5.4.0]-7-undecene (DBU), 1,5-diazabicyclo[4.3.0]-5-nonene (DBN), 2,4-diazabicyclo[2.2.2]octane (DABCO), N,N-dimethylaniline, and N,N-diethylaniline. More preferably, the basic catalyst may be any one selected from the group consisting of trimethylamine, triethylamine, tripropylamine and combinations thereof.

The reaction process may involve the use of a reaction solvent, and can be carried out at a certain reaction temperature for a certain reaction time.

The reaction solvent may be any solvent that is capable of dissolving the compound represented by the formula (2) and the compound represented by the formula (3), or capable of dissolving the copolymer containing the repeating unit represented by the formula (1).

The reaction solvent may be any one selected from the group consisting of esters, ethers, lactones, ketones, amides, alcohols and combinations thereof. Specific examples of the reaction solvent include methanol, ethanol, propanol, butanol, 2-methyl-1-propanol, acetone, acetonitrile, tetrahydrofuran, dimethyl sulfoxide, toluene, hexane, ethyl acetate, ethyl ether, cyclohexanone, methyl 2-n-amyl ketone, butyanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, dichloromethane, chloroform, carbon tetrachloride, acetonitrile, dioxane, dimethylformamide, dimethylacetamide, and combinations thereof.

The reaction solvent may be preferably any one selected from the group consisting of dichloromethane, chloroform, carbon tetrachloride, acetonitrile, ethyl acetate, ethyl ether, dioxane, dimethylformamide, dimethylacetamide, ethanol, methanol, isopropanol, acetone, and combinations thereof, and more preferably, any one selected from the group consisting of dichloromethane, dimethylformamide and combinations thereof can be applied.

The reaction temperature may be −20° C. to 150° C., and preferably 0° C. to 70° C. If the reaction temperature is lower than −20° C., stirring may be difficult during the reaction step, and if the reaction temperature is higher than 150° C., the production of side products may increase.

The reaction time may be 0.5 to 15 hours, and preferably 1 to 10 hours. When the reaction time is within the range described above, an appropriate yield may be achieved during the reaction process.

In the reaction process, the compound represented by the formula (2) and the compound represented by the formula (3) can be used at a molar ratio of 1:0.5 to 1:3.0, and preferably at a molar ratio of 1:0.8 to 1:1.7. When the reaction is carried out by mixing the compound represented by the formula (2) and the compound represented by the formula (3) at the molar ratio described above, the reaction yield can be increased.

The reaction process includes a step of dissolving the compound represented by the formula (2) in the reaction solvent described above, adding the compound represented by the formula (3) and the basic catalyst to the reaction solvent to prepare a reaction solution; a step of carrying out the reaction while stirring the reaction solution at the reaction temperature specified above for the reaction time specified above; and a step of purifying the reaction solution after completion of the reaction.

The basic catalyst is can be applied in an amount of 1 to 10 molar equivalents, or in an amount of 1 to 5 equivalents by weight, based on the compound represented by the formula (2).

The step of purifying the reaction solution may be carried out by applying any method capable of purifying the copolymer containing the repeating unit represented by the formula (1), and may include a washing step of diluting the reaction product with an organic solvent, and washing the dilution with an excess amount of distilled water, an aqueous solution of potassium carbonate, and distilled water in this order; a separation step of separating the organic layer; and a collection step of precipitating the separated organic layer with a mixed solvent of water and methanol, and filtering and drying the precipitate.

The copolymer containing the repeating unit represented by the formula (1) that has been polymerized by the method described above is a polyacetal-based resin, and can be utilized not as a conventional radical copolymer but as a molecular glass type resist.

Furthermore, the copolymer has an incorporated acetal structure so that the copolymer can also be utilized as a single molecule type resist composition with improved sensitivity.

The copolymer can be included in a photoresist composition together with a photo-acid generator and additives, and in this case, the photoresist composition can be applied as a resist material having high heat resistance, excellent film-forming properties, and improved alkali developability and etching resistance, with almost no sublimability.

Particularly, the copolymer is useful as a main ingredient forming a thin film of resist, and when the copolymer is applied to a positive resist composition which is exposed to extreme ultraviolet (EUV) radiation or an electron beam, superior effects may be obtained.

The resist composition according to another embodiment of the present invention contains the copolymer containing a repeating unit represented by the formula (1).

The resist composition can further contain any one selected from the group consisting of a photo-acid generator, a solvent, additives and combinations thereof. In regard to the additives, any additives that are conventionally applied to resist compositions can be applied, and specific examples include an alkali dissolution inhibitor, an acid diffusion inhibitor, a surfactant, a sensitizer and combinations thereof.

The photo-acid generator may any compound capable of generating acid upon exposure, and examples thereof include onium salt compounds, sulfonyloxyimide compounds, sulfonium salt compounds and iodide salt compounds. Further examples include sulfone compounds, sulfonic acid ester compounds, diazonium salt compounds, disulfonylmethane compounds, oxime sulfonate compounds, and hydrazine sulfonate compounds, but the photo-acid generator is not intended to be limited to these.

The solvent may be any organic solvent that is conventionally applied to a resist composition, and specific examples include lactones, amides, aromatic hydrocarbons, ketones, esters (including aliphatic carboxylic acid esters, lactic acid esters, and propylene glycol monoalkyl ether acetate), propylene glycol dialkyl ethers, propylene glycol monoalkyl ethers, and ethylene glycol monoalkyl ether acetates.

The alkali dissolution inhibitor may be any alkali dissolution inhibitor that is conventionally applied to a resist composition, and a phenolic derivative or a carboxylic acid derivative may eb used.

The acid diffusion inhibitor has an effect of controlling the diffusion of an acid generated by light irradiation in the resist film, and thereby suppressing a chemical reaction in unexposed areas. Examples that can be applied include nitrogen compounds, such as amines including monoalkylamines, such as n-hexylamine, and diethylenediamine, but the acid diffusion inhibitor is not limited to these.

The surfactant is intended to improve coatability, developability and the like, and examples thereof include, but are not limited to, polyoxyethylene lauryl ether, polyoxyethylene stearyl ether, polyoxyethylene, and polyethylene glycol dilaurate.

Examples of the sensitizer that can be applied include benzoazoles, anthracenes, and carbazoles, but the examples are not limited to these.

The resist composition can contain the copolymer containing the repeating unit represented by the formula (1) in an amount of 1% to 99% by weight relative to the total amount of the resist composition.

The resist composition may contain the copolymer containing a repeating unit represented by the formula (1) in an amount of 5% to 15% by weight, and the solvent in an amount of 90% to 75% by weight, relative to the total amount of the resist composition, with the balance being the photo-acid generator and the additives.

The resist composition can be used to form a resist pattern by a resist pattern forming method which includes a step of forming a resist film on a substrate, a step of exposing the resist film, and a step of developing the resist film to form a resist pattern.

Specifically, the resist composition is applied on a substrate such as a silicon wafer, using a spinner or the like, and the applied resist composition is treated by prebaking to thereby form a resist film. The resist film is selectively exposed and patterned using an exposure apparatus such as an EUV exposure apparatus, and then is subjected to post-exposure bake (PEB) and development with an alkali developer liquid. Subsequently, the developed resist film is washed and dried, and thus a resist pattern can be obtained.

The exposure can be carried out using far-ultraviolet radiation, KrF excimer laser light, ArF excimer laser light, EUV, vacuum UV (VUV), X-radiation, an electron beam or the like, and particularly, EUV, VUV, X-radiation and an electron beam are useful.

EXAMPLES

Hereinafter, the present invention will be described in detail by way of Examples, so that the invention can be easily carried out by a person having ordinary skill in the art to which the present invention is pertained. However, the present invention can be realized in various different embodiments, and is not intended to be limited to the Examples that will be described below.

Synthesis Examples for Copolymer

Synthesis Example 1

50 g (0.198 moles) of 1,3-adamantane diacetic acid, which is a compound represented by the formula (2), was dissolved in dimethylacetamide solvent, and then 22.8 g (0.198 moles) of dichloromethyl methyl ether was slowly poured to the solution at room temperature (25° C.). At the same temperature, 44 g (0.435 moles) of triethylamine was slowly added to the solution, and thus a reaction solution was prepared.

The reaction solution was allowed to react while stirred for 5 hours, and the reaction solution was diluted with ethyl acetate. The dilution was washed three times with an excess amount of distilled water, and then was washed again with an aqueous solution of potassium carbonate and with distilled water.

The reaction solution was separated to obtain an organic layer, and the organic layer was concentrated. The concentrated reaction product was precipitated by using a mixed solution of distilled water and methanol, and then the precipitate was filtered and dried. Thus, 48 g (yield 82%) of a copolymer containing a repeating unit represented by the following formula (1-11) was obtained. The copolymer containing the repeating unit represented by the following formula (1-11) had a weight average molecular weight as measured by gel permeation chromatography of 5,280 g/mol, and a molecular weight distribution of 3.38. The NMR data of the copolymer of the formula (1-11) are presented in FIG. 1.

[Chemical Formula 1-11]

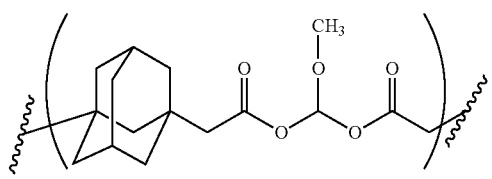

Synthesis Example 2

Figure 2:
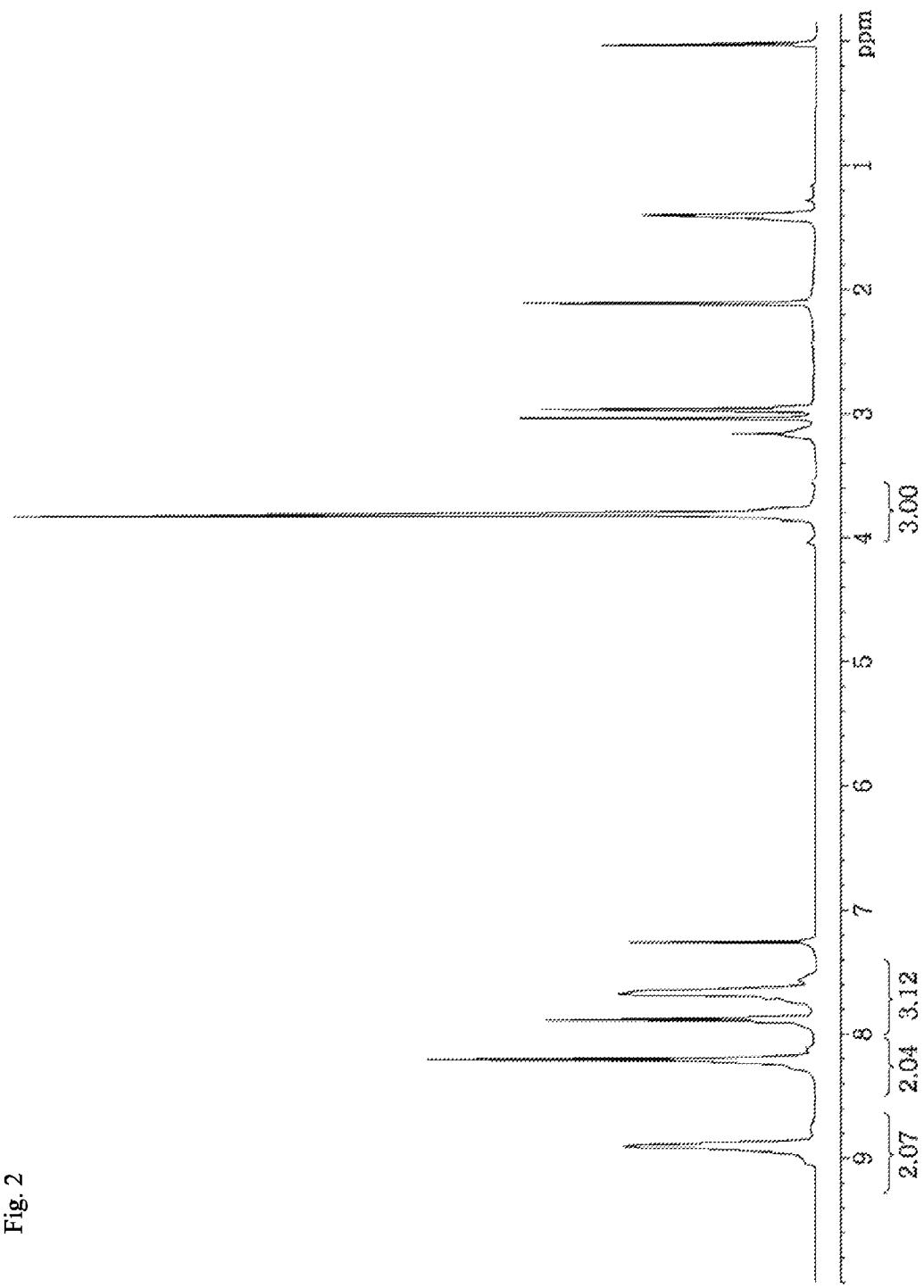
FIG. 2 shows the NMR data of the copolymer represented by the formula (1-12) produced in Synthesis Example 2 according to an embodiment of the present invention.

A reaction was carried out in the same manner as in Synthesis Example 1, except that 50 g (0.231 moles) of naphthalene-1,4-dicarboxylic acid was used instead of 50 g of the 1,3-adamantanediacetic acid used in Synthesis Example 1. Thus, 51 g (yield 85%) of a copolymer containing a repeating unit represented by the following formula (1-12) was obtained. The copolymer containing the repeating unit represented by the following formula (1-12) had a weight average molecular weight as measured by gel permeation chromatography of 6,647 g/mol, and a molecular weight distribution of 3.15. The glass transition temperature (Tg) was 110.6° C. The NMR data of the copolymer of formula (1-12) are presented in FIG. 2.

[Chemical Formula 1-12]

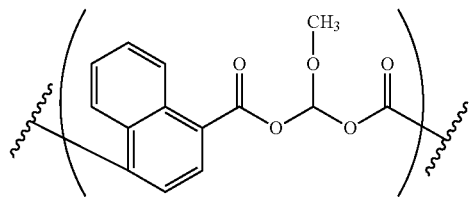

Synthesis Example 3

Figure 3:
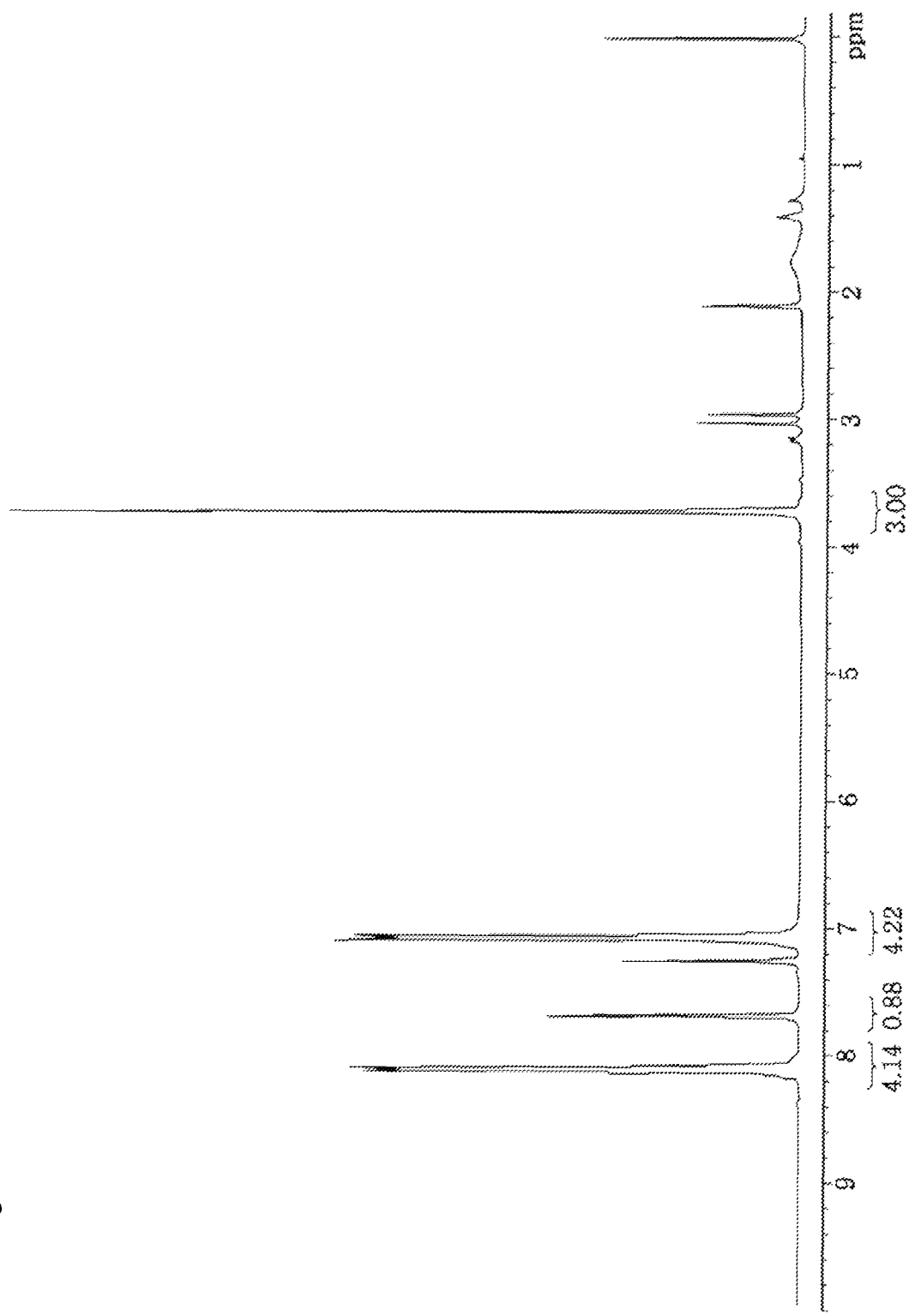
FIG. 3 shows the NMR data of the copolymer represented by the formula (1-13) produced in Synthesis Example 3 according to an embodiment of the present invention.

A reaction was carried out in the same manner as in Synthesis Example 1, except that 50 g (0.194 moles) of 4,4-oxybisbenzoic acid was used instead of 50 g of the 1,3-adamantanediacetic acid used in Synthesis Example 1. Thus, 55 g (yield 94.5%) of a copolymer containing a repeating unit represented by the following formula (1-13) was obtained. The copolymer containing the repeating unit represented by the following formula (1-13) had a weight average molecular weight as measured by gel permeation chromatography of 27,479 g/mol, and a molecular weight distribution of 3.85. The glass transition temperature (Tg) was 138.9° C. The NMR data of the copolymer of formula (1-13) are presented in FIG. 3.

[Chemical Formula 1-13]

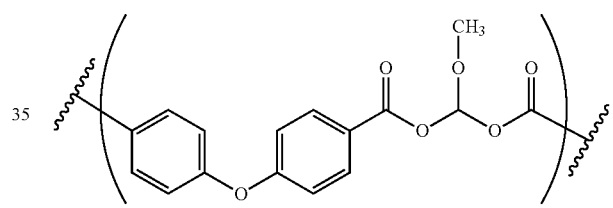

Synthesis Example 4

Figure 4:
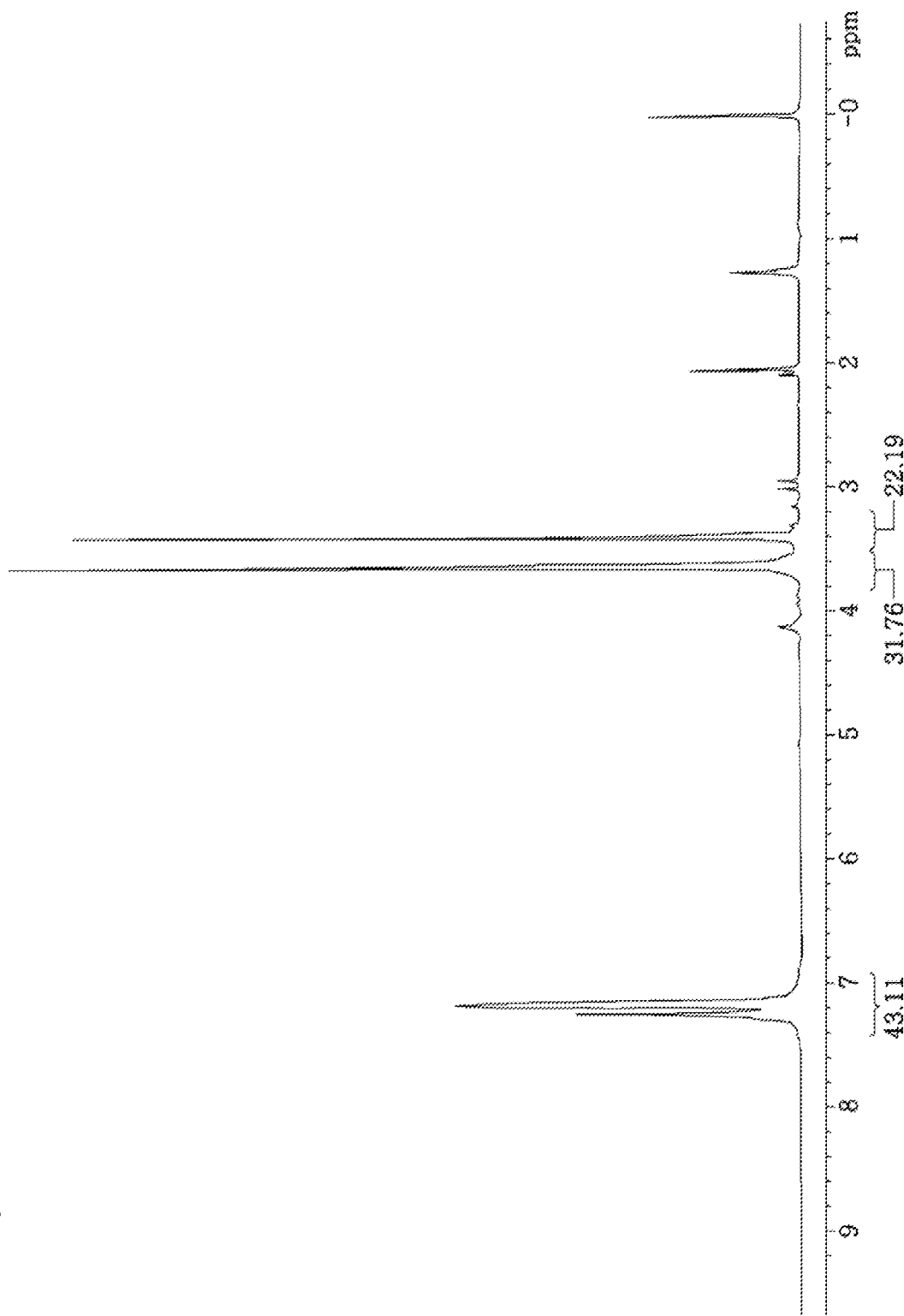
FIG. 4 shows the NMR data of the copolymer represented by the formula (1-14) produced in Synthesis Example 4 according to an embodiment of the present invention.

A reaction was carried out in the same manner as in Synthesis Example 1, except that 50 g (0.3 moles) of m-phenylenedicarboxylic acid was used instead of 50 g of 1,3-adamantanediacetic acid used in Synthesis Example 1. Thus, 53 g (yield 85%) of a copolymer containing a repeating unit represented by the following formula (1-14) was obtained. The copolymer containing the repeating unit represented by the following formula (1-14) had a weight average molecular weight as measured by gel permeation chromatography of 2,928 g/mol, and a molecular weight distribution of 2.42. The NMR data of the copolymer of formula (1-14) are presented in FIG. 4.

[Chemical Formula 1-14]

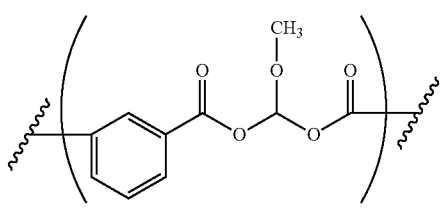

Examples and Comparative Examples

Formation of Resist and Property Evaluation

Resist compositions of Examples and Comparative Examples were respectively mixed at the compositions and content ratios as indicated in the following Table 1, and the mixtures were filtered through a 0.2-μm membrane filter. Thus, resist solutions were prepared. Each of the resist solutions was applied on a silicon wafer substrate using a spinner, and was dried at 110° C. for 90 seconds to form a resist film having a thickness of 0.20 μm. The resist film was exposed using an E-beam exposure apparatus, BX9300FS (JEOL, Ltd.) under the conditions of 100 keV, and after exposure, the resist film was subjected to a heat treatment (post-exposure bake) at 110° C. for 90 seconds, and to development with a 2.28 wt % aqueous solution of tetramethylammonium hydroxide as a developer liquid for 40 seconds. The developed resist film was washed and dried, and thus a resist pattern was formed. The evaluation results for the Examples and Comparative Examples are presented in Table 1.

TABLE 1

| | Resin (100 parts by weight) | *PAG (parts by weight) | *Base (parts by weight) | Sensitivity ($\mu C/cm^2$) | Resolution (nm) | LER (nm) |
|---|---|---|---|---|---|---|
| Example 1 | Synthesis Example 1 | 4.0 | 0.5 | 30 | 70 | 3 |
| Example 2 | Synthesis Example 2 | 4.0 | 0.5 | 40 | 70 | 4 |
| Example 3 | Synthesis Example 3 | 4.0 | 0.5 | 50 | 90 | 5 |
| Example 4 | Synthesis Example 4 | 4.0 | 0.5 | 30 | 60 | 3 |
| Comparative Example 1 | Resin A | 4.0 | 0.5 | 80 | 100 | 6 |

*PAG: Triphenylsulfonium triflate
*BASE: Tetramethylammonium hydroxide as a basic additive
* Resin A of Comparative Example: Copolymer represented by the following formula (4)
[Chemical Formula 4]

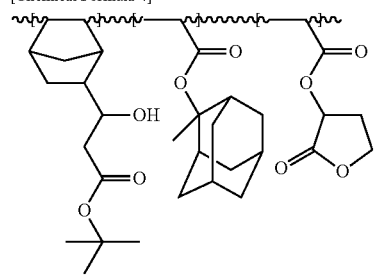

The sensitivity was determined such that the exposure amount which can form a 0.10-μm line-and-space (L/S) pattern at a line width of 1:1 after development, was designated as the optimum exposure amount, and the optimum exposure amount was used to indicate sensitivity. The minimum pattern dimension obtained at this time was designated as the resolution. Smaller values of the sensitivity and resolution indicate superior characteristics.

The LER (line edge roughness) was determined by observing the roughness of a 0.10-μm line-and-space (L/S) pattern formed after development. A smaller value of LER indicates superior LER characteristic.

From the results of Table 1, it can be confirmed that the Examples all exhibited excellent effects in terms of sensitivity, resolution and line edge roughness, as compared with the Comparative Examples. Furthermore, Examples 1 and 3 exhibited superior results in terms of sensitivity and line edge roughness.

Preferred embodiments of the present invention have been described above in detail. However, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A copolymer having a main chain comprising a repeating unit represented by the following formula (1):

[Chemical Formula 1]

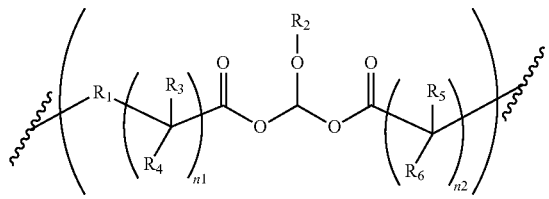

wherein R1 represents any one selected from the group consisting of an alkanediyl group, a heteroalkanediyl group, a cycloalkanediyl group, a heterocycloalkanediyl group, an arylene group, a heteroarylene group, and an alkylarylene group;

R2 represents any one selected from the group consisting of a hydrogen atom, an alkyl group, a heteroalkyl group, a cycloalkyl group, a heterocycloalkyl group, an aryl group, a heteroaryl group, an alkoxy group and an alkylalkoxy group;

R3, R4, R5 and R6 each independently represent any one selected from the group consisting of a hydrogen atom and an alkyl group having 1 to 5 carbon atoms;

n1 represents an integer from 0 to 10; and n2 represents an integer from 0 to 10.

2. The copolymer according to claim 1, wherein R1 represents any one selected from the group consisting of moieties represented by the following formulas (1-1) to (1-4):

[Chemical Formula 1-1]

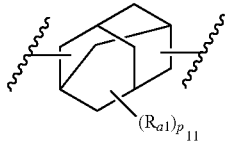

[Chemical Formula 1-2]

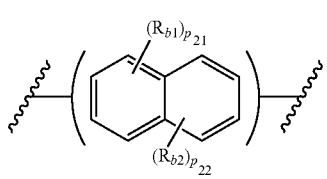

[Chemical Formula 1-3]

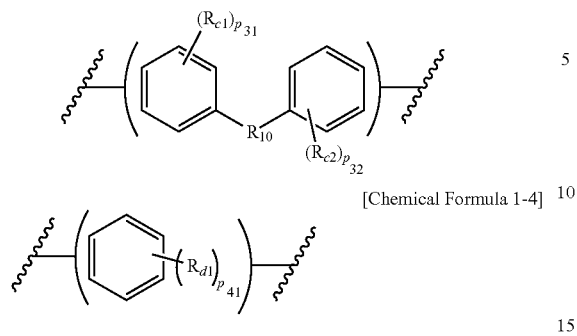

[Chemical Formula 1-4]

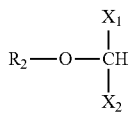

wherein in the formulas (1-1) to (1-4),
Ra1, Rb1, Rb2, Rc1, Rc2 and Rd1 each independently represent any one selected from the group consisting of an alkyl group having 1 to 10 carbon atoms and an alkoxy group having 1 to 10 carbon atoms;
R10 represents any one selected from the group consisting of O, NR', S and CO;
R' represents any one selected from the group consisting of a hydrogen atom and an alkyl group having 1 to 5 carbon atoms;
P11 represents an integer from 1 to 14;
P21 and P22 each independently represent an integer from 1 to 4, and the sum of P21 and P22 is not greater than 6;
P31 and P32 each independently represent an integer from 1 to 5, and the sum of p31 and p32 is not greater than 8; and
P41 represents an integer from 1 to 4.

3. The copolymer according to claim 1, wherein the copolymer has a weight average molecular weight as measured by gel permeation chromatography of 500 to 100,000 g/mol.

4. A method for producing a copolymer having a main chain containing a repeating unit represented by the following formula (1), the method comprising allowing a compound represented by the following formula (2) and a compound represented by the following formula (3) to react in the presence of a basic catalyst:

[Chemical Formula 1]

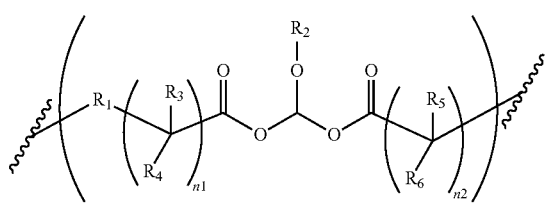

[Chemical Formula 2]

$$R_2-O-\underset{X_2}{\overset{X_1}{\underset{|}{\overset{|}{CH}}}}$$

[Chemical Formula 3]

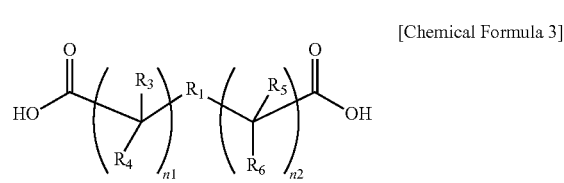

wherein in the formulas (1) to (3),
R1 represents any one selected from the group consisting of an alkanediyl group, a heteroalkanediyl group, a cycloalkanediyl group, a heterocycloalkanediyl group, an arylene group, a heteroarylene group, and an alkylarylene group;
R2 represents any one selected from the group consisting of a hydrogen atom, an alkyl group, a heteroalkyl group, a cycloalkyl group, a heterocycloalkyl group, an aryl group, a heteroaryl group, an alkoxy group and an alkylalkoxy group;
R3, R4, R5 and R6 each independently represent any one selected from the group consisting of a hydrogen atom and an alkyl group having 1 to 5 carbon atoms;
X1 and X2 each independently represent any one selected from the group consisting of a halogen atom and an alkoxy group having 1 to 10 carbon atoms;
n1 represents an integer from 0 to 10; and
n2 represents an integer from 0 to 10.

5. The method for producing a copolymer according to claim 4 containing a repeating unit represented by the formula (1), wherein the basic catalyst is any one selected from the group consisting of an amine, a pyridine and combinations thereof.

6. The method for producing a copolymer according to claim 4 containing a repeating unit represented by the formula (1), wherein the compound of formula (2) and the compound of formula (3) are used at a molar ratio of 1:0.5 to 1:3.0.

* * * * *